United States Patent [19]

Tyson et al.

[11] Patent Number: 5,380,683
[45] Date of Patent: Jan. 10, 1995

[54] IONIZED CLUSTER BEAM DEPOSITION OF SAPPHIRE AND SILICON LAYERS

[75] Inventors: Scott M. Tyson; Richard Y. Kwor; Leonard L. Levenson, all of Colorado Springs, Colo.

[73] Assignee: United Technologies Corporation, Hartford, Conn.

[21] Appl. No.: 955,603

[22] Filed: Oct. 2, 1992

[51] Int. Cl.$^6$ .............. H01L 21/00; H01L 21/02; H01L 21/302; H01L 21/463
[52] U.S. Cl. .................................. 437/236; 437/235
[58] Field of Search ................... 437/235, 236; 250/423 R, 424, 427

[56] References Cited

U.S. PATENT DOCUMENTS

| | | | |
|---|---|---|---|
| 4,066,527 | 1/1978 | Takagi et al. | 204/192 N |
| 4,082,636 | 4/1978 | Takagi | 204/192 N |
| 4,139,857 | 2/1979 | Takagi et al. | 357/15 |
| 4,152,478 | 5/1979 | Takagi | 428/221 |
| 4,161,418 | 7/1979 | Morimoto | 148/175 |
| 4,217,855 | 8/1980 | Takagi | 118/719 |
| 4,374,162 | 2/1983 | Takagi | 427/248.1 |
| 4,427,711 | 1/1984 | Martin | 427/10 |
| 4,581,113 | 4/1986 | Morimoto et al. | 204/192 N |
| 4,799,454 | 1/1989 | Ito | 118/723 |
| 4,805,555 | 2/1989 | Itoh | 118/719 |
| 4,834,809 | 5/1989 | Kakihara | 148/33 |

OTHER PUBLICATIONS

Surface Science 168 (1986); Yamada and Takagi; pp. 365–375; "Film and Interface Properties of Epitaxial Metal/Insulator/Semiconductor Systems Formed by Ionized Cluster Beam Deposition".
Nuclear Instruments and Methods in Physics Research B55 (1991); Yamada; pp. 544–549; "Recent Progress in Depositing Epitaxial Metal Films by an Ionized Cluster Beam".
J. Appl. Phys. 64(9) (Nov. 1, 1988); Yamada and Torii; pp. 4509–4515; "Thin Heteroepitaxial Si-ON-Sapphire Films Grown at 600° C. by Reactive Beam Deposition". Applied Surface Science 33/34 (1988); Urban et al.; pp. 966–971; "Optical Properties of Reactive ICB Aluminum Oxide Film Deposited on Si(100 J. Appl. Phys. 63(1) (Jan. 1, 1988); Hashimoto et al.; Optical and Structural Characteristics of $AL_2O_3$ Films Deposited by the Reactive Ionized Cluster Beam Method", pp. 241–244. IEEE Transactions on Electron Devices 14(5); May 1987; Yamada et al.; "Metallization by Ionized Cluster Beam Deposition", pp. 1018–1025.
Nuclear Instruments and Methods in Physics Research B46 (1990); Soskowski; pp. 397–404; "Ionized Cluster Beam Deposition and Thin Insulating Films".
Japanese Journal of Applied Physics; 30/11B; Ito et al., pp. 3228–3232; (1988) "Ionized Cluster Beam Deposition Source for Aluminum and Aluminum Oxide Formation".

*Primary Examiner*—R. Bruce Breneman
*Assistant Examiner*—B. Everhart

[57] ABSTRACT

Sapphire, a highly stable oxide of aluminum having the chemical formula of $Al_2O_3$, is placed in a crucible. The crucible is heated to vaporize the sapphire therein. The sapphire vapor is ejected through a nozzle in the crucible and into a region having a vacuum pressure of approximately $10^{-5}$ Torr or less. As the vapor leaves the crucible through the nozzle, atom aggregates or clusters are formed through a supercooled phenomenon due to adiabatic expansion. The vacuum region has disposed therein a substrate of silicon. The sapphire vapor is accelerated towards the substrate where it deposits on a surface of the substrate in a uniformly distributed thin layer.

48 Claims, 1 Drawing Sheet

IONIZED CLUSTER BEAM DEPOSITION OF SAPPHIRE AND SILICON LAYERS

CROSS REFERENCE TO RELATED APPLICATIONS

This application is related to patent application (U.S. Serial No. 07/955,607) titled Ionized Cluster Beam Deposition of Sapphire, filed on even date herewith.

1. Technical Field

The invention relates to ionized cluster beam deposition of films or layers of material on a substrate, and more particularly, to ionized cluster beam deposition of a film of a particular oxide of aluminum—sapphire—on a substrate of silicon for use in semiconductor applications.

2. Background Art

In the art of deposition of films of material on a substrate, there are many known techniques, including vacuum deposition, ion plating, ion- and plasma-assisted, and the more modern Ionized Cluster Beam ("ICB") technique. ICB is an ion-assisted technique in which the material to be deposited on a substrate is heated in a closed crucible and its vapor ejected through a small nozzle into a vacuum region. The vapor forms loosely held clusters each comprising 100 to 2000 atoms. Some of the ejected vaporized material is ionized by electron bombardment and is accelerated toward the substrate, which is also disposed in the vacuum region. The material arrives at the substrate surface to be deposited thereon together with the neutral (non-ionized) component of the vapor. ICB offers the ability to control the deposited film structure by applying kinetic energy to the cluster vapor beam during film deposition. Kinetic energy control is achieved by varying, inter alia, the acceleration voltage and the electron current for ionization.

In most of the known ion- and plasma-assisted deposition techniques, the individual atoms of the material to be deposited on the substrate impact the substrate with too much kinetic energy, producing a high number of defects. However, with ICB a more useful lateral energy is obtained as the cluster impacts the substrate and the atoms break off. ICB deposition offers the possibility of getting useful energy into the film formation process without damaging the film and substrate surface. Due to the effects of ionized cluster bombardment, ICB produces films with high density, strong adhesion, a low impurity level, and a smooth surface. Further, some of the properties of the films usually associated with high substrate temperature in conventional vacuum depositions can be obtained at low substrate temperature in the ICB technique. This results in a distinct advantage in semiconductor device fabrication. U.S. Pat. Nos. 4,152,478 and 4,217,855 to Takagi describe and claim the ICB method and corresponding apparatus.

In the field of semiconductor processing, the aforementioned deposition techniques have been employed, all with varying disadvantages. Standard bulk silicon-based semiconductor technologies are inherently sensitive to elevated temperature operation as well as to the exposure of ionizing radiation to the large charge collection volumes within the devices. Also, the high parasitic capacitances in these devices tend to decrease operating performance (e.g., speed). These factors have prompted migration to a silicon-on-insulator ("SOI") substrate technology in which collection volumes and parasitic capacitances are dramatically reduced. Several SOI substrate technologies currently exist, e.g., SIMOX, ISE/ZMR, BESOI, FIPOS, etc. However, these technologies possess poor manufacturability or provide poor quality substrates. The result is an expensive substrate which is inadequate for most applications. For example, a five (5) inch SIMOX (i.e., "separation by implantation of oxygen") wafer costs approximately $500–800, compared to $40 for a five (5) inch bulk silicon wafer.

Semiconductor devices have been manufactured on silicon-on-sapphire ("SOS") substrates for several years. However, these SOS wafers are relatively expensive (approximately $500 each) and of very low quality. Additionally, these substrates are incompatible with bulk silicon processing tools due to their thickness, lack of flatness, poor silicon uniformity, and thermal sensitivity. The thickness of the sapphire substrate provides an extremely high hole trapping volume when exposed to total dose ionizing radiation. This complicates the radiation hardened ("rad-hard") aspects of the device design. Also, the sapphire substrates can only be made of a limited size (e.g., five (5) inch wafer diameter or less), making SOS incompatible with trends in VLSI processing.

In order to achieve optimum high temperature performance for semiconductors, a high quality but thin layer of device silicon is required. Up to now, currently available deposition techniques have not adequately provided the quality and thickness control required in these semiconductor applications.

It has been reported that aluminum oxide films of $Al_2O_3$ (i.e., sapphire) have been prepared using ionized Al clusters from an ICB source together with $O_2$ introduced into a vacuum chamber. See Ito et al., "Ionized Cluster Beam Deposition Source for Aluminum and Aluminum Oxide Formation", *Japanese Journal of Applied Physics*, Vol. 30, No. 11B, November, 1991, pp. 3228–3232. The ICB apparatus described therein has no electron extractor. Such use of $O_2$ is referred to as a reactive ionized cluster beam process, or R-ICB. A further example of the preparation of $Al_2O_3$ using the R-ICB method is found in Sosnowski et al., "Ionized Cluster Beam Deposition and Thin Insulating Films", *Nuclear Instruments and Methods in Physics Research*, B46, (1990), pp. 397–404.

Sapphire, the highly stable oxide of aluminum, is used in many applications due to its many advantageous features. Such features include high melting temperature, chemical stability and resistance to many commercial etchants, ease of maintaining proper stoichiometry, optical transparency, excellent dielectric properties, high thermal conductivity, ease of handling, relatively low cost, and relatively low deposition temperature. In the semiconductor industry, deposited films such as sapphire, crystalline polysilicon ("poly"), or aluminum alloys are used to create many of the wiring and insulating layers. After the metal layers are patterned, dielectric films are used to electrically isolate one metal layer of wiring from another. In this context, the dielectric properties of the film are highly important. Also, the ability to conduct heat away from the active devices or from the metal wiring is significant from a reliability standpoint.

However, in both of the abovereported $Al_2O_3$ ICB deposition techniques, the starting material was aluminum and not sapphire. The aluminum was vaporized and accelerated through the oxygen environment. It is well known that aluminum in an oxygen ambient is highly reactive. Thus, the crucible containing the aluminum starting material typically comprises a more costly tungsten material instead of a lesser expensive graphite. Also, the oxygen introduces yet another complexity, i.e., that of uniformly controlling the flow rate of the oxygen across the diameter of the wafer. Any resulting perturbations in the flow rate can cause a lack of uniformity in the deposition of the resulting $Al_2O_3$ on the substrate. Therefore, up until now, no method of depositing $Al_2O_3$ directly onto a silicon substrate using the ICB methodology has been reported.

DISCLOSURE OF INVENTION

On aspect of the present invention is to provide a method of depositing a layer of $Al_2O_3$ on a substrate using the ionized cluster beam methodology and apparatus. A further aspect of the present invention is to provide an easily manufacturable method, using the ionized cluster beam methodology and apparatus, of depositing a high quality yet thin layer of $Al_2O_3$ on a silicon substrate for use in high temperature semiconductor applications.

According to the present invention, sapphire, an oxide of aluminum having the chemical formula of $Al_2O_3$, is placed in a crucible. The crucible is heated to vaporize the sapphire therein. The sapphire vapor is ejected through a nozzle in the crucible and into a region having a vacuum pressure of approximately $10^{-5}$ Torr or less. As the vapor leaves the crucible through the nozzle, atom aggregates or clusters are formed through a supercooled phenomenon due to adiabatic expansion. The vacuum region has disposed therein a substrate of bulk silicon. The sapphire vapor is accelerated towards the substrate where it deposits on a surface of the silicon substrate in a uniformly distributed thin layer.

In further accord with the present invention, a second crucible has disposed therein a predetermined amount of silicon. In a similar manner to the sapphire, the second crucible is heated to vaporize the silicon and the silicon vapor is ejected through a nozzle in the second crucible into the vacuum region. As the silicon vapor leaves the second crucible through the nozzle, atom aggregates or clusters are formed and the silicon clusters are accelerated towards the substrate where they deposit in a uniformly distributed thin layer on top of the aforedescribed deposited sapphire layer.

The present invention has utility in providing an inexpensive, yet highly manufacturable, ICB substrate material technology having, relative to the aforementioned prior art deposition techniques, improved interface properties, excellent film thickness control and uniformity, high batch to batch uniformity due to single wafer processing, improved silicon quality, and freedom from conductive buried pipes. These attributes translate into improved parametric performance of the resulting semiconductor device over varying temperature due to fewer recombination and generation sites. The thin buried dielectric film also provides for enhanced radiation hardening.

The present invention represents an alternative to currently available SOI substrate technologies. It is highly manufacturable and provides low cost SOI substrates. It also provides reduced substrate damage and high deposition rates at low temperatures. Applications for such substrates include high temperature and radiation environments, along with integrated sensors. Further, the selection of crystalline $Al_2O_3$ as the dielectric material in the SOI application is based upon its close lattice constant match to the silicon crystal structure as well as to sapphire's ability to withstand standard silicon semiconductor fabrication techniques and environments. In addition, the crystalline $Al_2O_3$ insures the proper stoichiometry of the aluminum and oxygen components.

These and other objects, features and advantages of the present invention will become more apparent in light of the detailed description of a best mode embodiment thereof, as illustrated in the accompanying drawings.

BEST MODE FOR CARRYING OUT THE INVENTION

Figure 1:
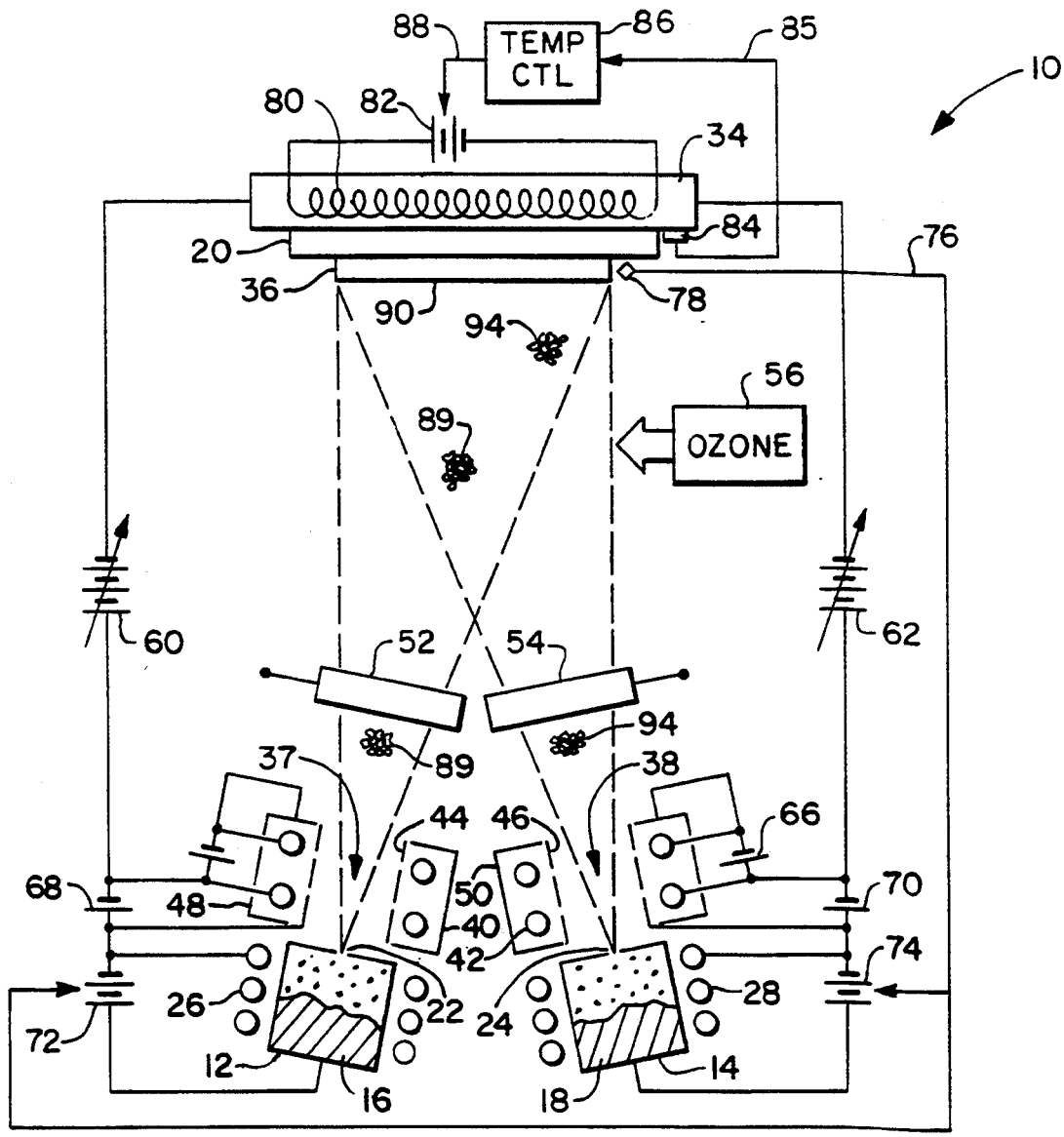
FIG. 1 is a schematic illustration of ICB apparatus for depositing layers of $Al_2O_3$ and silicon on a bulk silicon substrate in accordance with the present invention.

Referring to FIG. 1, the known ICB material deposition apparatus 10 illustrated therein is available from, e.g., Mitsubishi Corporation, Itami Works, Hyogo, Japan. The general operating principle of the ICB apparatus 10 is as follows: clusters of atomic material to be deposited on a substrate are formed by adiabatic expansion of material vapor passing through a nozzle. The clusters are then ionized by impact ionization using electrons of an appropriate energy. Cluster sizes distribute in a range of, e.g., 100 to 2000 atoms per cluster. The cluster bombard the substrate surface, and both ionized and neutral clusters are broken up and redistributed due to the high surface mobility of the loosely-held clusters. The scattered atoms may move over the surface with such surface diffusion energy before they are physically attracted to the substrate surface. Such attraction is due to high kinetic energy parallel to the surface caused by conversion from the incident kinetic energy. Thus, the crystallographic structure and physical properties of thin films are found to be strongly dependent upon the energy of the ionized material, such energy being controlled by the acceleration voltage during film deposition and, to a lesser extent, by the temperature of the substrate.

The aforementioned U.S. Pat. Nos. 4,152,478 and 4,217,855 to Takagi describe the Ionized Cluster Beam ("ICB") method and corresponding device, these patents being hereby incorporated by reference. Further, these patents describe in detail the mechanism of cluster formation by referring to microscopic analysis based upon statistical mechanics.

The method of depositing a thin, high quality film of sapphire on a bulk silicon substrate in accordance with the present invention is described hereinafter with reference to FIG. 1. The ICB apparatus 10 includes at least two closed-type crucibles 12,14, each holding a desired type of source material 16,18 to be deposited on a substrate 20 of desired material. Both crucibles 12,14 may be comprised of, e.g., relatively inexpensive but purified graphite. A first crucible 12 contains $Al_2O_3$ (sapphire) 16 in one of many physical forms: either pellets, powder, granules, sphereodized, etc. The sapphire 16 is commercially available from Crystar, Victoria, British Columbia, Canada. The second crucible 14 contains silicon 18 in one of many similar physical forms. The physical form of both the sapphire and silicon in the crucibles is irrelevant to the invention since, as will be described hereinafter, each material is heated and melted until its vapor state is realized.

Each crucible has at least one small diameter ejection nozzle 22,24. Also, each crucible has heating elements 26,28, e.g., filaments, disposed adjacent to the walls thereof. The filaments 26,28 heat the crucible by emitting electrons which impact the crucible. It is to be understood, however, that crucible heating may occur through other methods. One is radiation heating where heat is generated by a crucible heating filament. Another is resistance heating using electrons emitted from filaments located within the crucible walls. In this method electrical current is flowed directly through the outer surface of the crucible. The method chosen for heating the crucible is irrelevant to the present invention; any method or combination thereof may be used without departing from the broadest scope thereof.

A substrate holder 34, which holds the substrate 20, comprises an electrically conducting material. As described in more detail hereinafter, a surface 36 of the substrate has the desired source material deposited thereon by the ICB apparatus 10 in accordance with the present invention.

Disposed above, and in proximity to, the ejection nozzle 22,24 of each crucible is a corresponding ionization chamber 37,38. Each chamber 37,38 has one or more filaments 40,42 for emitting electrons. Each chamber also has acceleration electrodes 44,46 for accelerating the electrons emitted from the filaments, and shields 48,50 for preventing undesirable scattering of the electrons. Disposed above each chamber is a shutter 52,54, which selectively prevents vapor of the source material ejected from the associated crucible 12,14 through its nozzle 22,24 from impinging on the substrate surface 36.

All of the aforementioned components of the ICB machine are disposed within a high vacuum chamber (not shown) having a pressure of preferably $10^{-5}$ Torr or less. An ozone source 56 may be provided for injecting a flow rate of ozone into the high vacuum chamber.

The ICB apparatus 10 also includes a pair of variable power supplies 60,62, each electrically connected between the substrate holder 34 and one of the ionization chambers 37,38. Each supply 60,62 maintains the substrate holder at a relatively high negative potential with respect to the associated chamber. The resulting electric field imparts kinetic energy to the positively ionized clusters for their accelerated movement toward the substrate surface.

A second pair of power supplies 64,66 is provided, each being connected to a corresponding filament 40,42 within an ionization chamber 37,38. The supply 64,66 energizes the filament, causing it to emit electrons.

Each supply in a third pair of power supplies 68,70 is connected between the filaments 40,42 of a corresponding ionization chamber 37,38 and acceleration electrode 44,46. Each supply 68,70 keeps the acceleration electrode at a highly positive potential with respect to the associated filament. This accelerates the electrons emitted from the filaments 40,42 the electrons ionizing some portion of the clusters in the ionization chambers. Thus, these supplies 68,70 provide the ionization current parameter discussed hereinafter.

Each power supply in a fourth pair of supplies 72,74 energizes the filaments 26,28 of the corresponding crucibles 12,14. The filaments emit electrons which heat the crucible in accordance with the aforedescribed electron impact method. Both power supplies 72,74 may be controlled by a signal on a line 76 provided by a quartz crystal 78. The crystal 78 is disposed in close proximity to the substrate 20. The crystal vibrates at a measurable frequency. As more of the desired material (e.g., sapphire) is deposited on the substrate, the vibration frequency of the crystal decreases. Since the change in the vibration frequency is related to the deposition rate, it follows from the foregoing that the crystal provides a simple method of monitoring the deposition rate of the sapphire on the substrate. Both supplies 72,74 are responsive to the signal on the line 76 to vary the heating of the respective crucible 12,14. As the deposition rate decreases, the crucible may be heated to effectively increase the deposition rate.

The substrate holder 34 has a heater 80 therein, e.g., a coil, for heating the substrate 20 to the desired epitaxial temperature. That is, if the substrate is assumed to be monocrystalline, and the material is epitaxially grown on the substrate, then the coil 80 heats the substrate to a temperature which facilitates epitaxial growth. A power supply 82 powers the coil in the substrate holder. A thermocouple 84 attached to the substrate provides a signal on a line 85 indicative of the temperature of the substrate. The signal is fed to a circuit 86 which compares the actual substrate temperature on the line 85 with a desired substrate temperature (e.g., epitaxial temperature) provided by an operator of the ICB apparatus. Any difference therebetween is provided on a signal line 88 to control the power supply 82.

In light of the foregoing description of the construction of the ICB machine 10, the method of depositing sapphire on a bulk silicon substrate, and of depositing silicon on the sapphire, according to the present invention follows. The sapphire starting material 16 is loaded into one of the crucibles 12, while the silicon starting material 18 is loaded into the other crucible 14. The bulk silicon substrate 20 is loaded into the substrate holder 34. The sapphire crucible heating filaments 26 and the substrate holder heater 80 are energized by the corresponding power supplies 72,82. As the sapphire crucible 12 heats up, the sapphire therewithin becomes a vapor.

The heating filaments 26 heat the crucible 12 containing the sapphire 16 to a desired temperature. The crucible temperature is regulated so that the pressures of the vapor in the crucible may exceed at least 100 times the pressure outside the crucible in the vacuum region. The greater the difference between the internal and external pressures of the crucible, the greater the ejection velocity of the vaporized material exiting the crucible.

Initially, a thin film of sapphire is deposited on the bulk silicon substrate. The lefthand shutter 52 is disposed to allow the sapphire material ejected from the nozzle 22 of the crucible 12 containing the sapphire to travel toward the substrate 20. The right hand shutter 54 is closed. The substrate heater 80 heats the substrate 20 to a temperature of 400 to 600 degrees C, with a preferred value of approximately 600 degrees C. The acceleration power supply 60 is initially set to 500 eV. The ionization current power supply 68 is adjusted to provide an ionization current in the range of 200 to 300 milliamps ("mA"), with a preferred value of 250 mA. The ozone source 56 is adjusted to provide an oxygen partial pressure within the high vacuum region in the range of $5 \times 10^{-5}$ to $1 \times 10^{-4}$ Torr.

The sapphire vapor in the crucible is ejected into the vacuum region where it is supercooled due to the adiabatic expansion thereof. As a result, the sapphire vapor forms atomic groups or clusters 89, each cluster 89 typically comprising approximately 100 to 2000 atoms loosely bonded together by van der Waals attractive forces.

Through kinetic energy imparted to the sapphire when ejected through the nozzle, the sapphire clusters 89 enter the ionization chamber 37. There, the sapphire clusters are bombarded by electrons emitted from the filaments 40. Such electron bombardment ionizes at least one of the atoms within several of the clusters, thus forming partially ionized clusters. The ionization current is controlled by the ionization power supply 68. Other clusters are not ionized and, thus, remain neutral.

The acceleration power supply 60 imparts kinetic energy to the ionized sapphire clusters to move and accelerate them toward the substrate. The energies imparted to the ionized clusters are controlled through variation of the acceleration power supply. The neutral clusters not ionized in the ionization chamber also move toward the substrate by the action of the kinetic energy received by the clusters when ejected out the crucible nozzle. When the clusters reach the substrate surface 36, both types of clusters impinge on the surface, forming thereon a high quality film of sapphire.

When the ionized clusters collide with the substrate, most of the kinetic energy of the clusters is converted into thermal energy. This energy is imparted to the substrate to the surface layer of sapphire being deposited thereon. At the same time, each ionized cluster itself is disintegrated into individual atomic particles which move on the deposited surface layer to facilitate the growth of a crystal due to the migration effects. Such effects can also be expected in the case of the neutral or non-ionized clusters. The migration effects are created at an elevated temperature caused by the thermal energy converted from the kinetic energy of the clusters and imparted to the deposited substrate surface layer. These effects cause the growth of a crystal film oriented by the crystal axis of the substrate.

The initial acceleration voltage of 500 eV causes the initial clusters that strike the substrate surface 36 to sputter and clean such surface. The acceleration voltage is then reduced to approximately 200 to 300 eV. Deposition of sapphire on the substrate surface proceeds at a rate of approximately 40 Angstroms per minute. A layer 90 of sapphire is epitaxially-deposited on the bulk silicon 20 to a thickness of between 200 and 4000 Angstroms.

Once the sapphire has been deposited to the desired thickness, the silicon is then deposited in a layer 96 (FIG. 2) on the surface of the sapphire layer 90. The procedure for silicon deposition is similar to that just described for sapphire, with the exception that the lefthand shutter 52 over the sapphire ionization chamber is closed to prevent sapphire clusters from reaching the substrate surface, while the righthand shutter 54 is opened to allow silicon clusters to reach the sapphire surface. The crucible 14 containing the silicon 18 is heated by energizing the filaments 28. The resulting silicon vapor clusters 94 strike the surface of the sapphire layer 90 and adhere thereto in a similar manner to the sapphire on the substrate surface. The layer 96 of crystalline silicon is epitaxially deposited on the sapphire layer to a thickness of between 500 and 20,000 Angstroms. The result is a wafer 98 comprising the bulk silicon substrate 20, the sapphire layer 90 deposited thereon, and the crystalline silicon layer 96 deposited on the sapphire.

Figure 2:
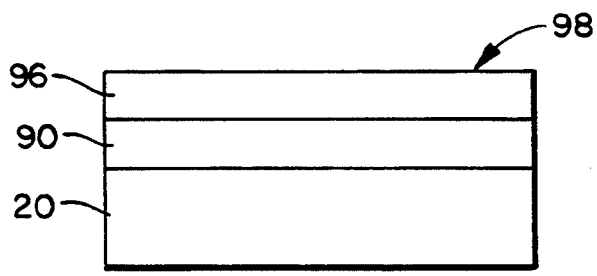
FIG. 2 is a plan view of the deposited layers of $Al_2O_3$ and silicon of FIG. 1.

Once the silicon layer has been formed, both shutters 52,54 are closed, all power supplies are turned off, and the resulting silicon-sapphire-bulk silicon wafer is allowed to cool before being removed from the ICB apparatus. Alternatively, a protective film of an oxide may be deposited on the surface of the deposited silicon before removing the wafer 98 from the ICB apparatus. Such deposition of oxide is well known to one of ordinary skill in the art. Although not required, the wafer may, if desired, be annealed at high temperature after removal from the ICB apparatus. FIG. 2 illustrates the resulting wafer 98.

With the method of the present invention, the total substrate fabrication time per wafer is approximately fifteen (15) minutes (not including heating and cooling times), and requires no additional thermal processing (i.e., annealing). By comparison, SIMOX substrates require greater processing time than that for oxygen implantation, but then additionally require a lengthy eight (8) hour high temperature thermal anneal plus silicon epitaxy processing or oxidation thinning to achieve the desired film thickness.

Although the present invention has been illustrated for use with ICB apparatus having at least two crucibles to accommodate the sapphire and silicon, it is to be understood that ICB apparatus having a single crucible may be used without departing from the scope of the present invention. However, use of a single crucible adds relatively much more time to the fabrication of the semiconductor device as taught herein. This is because a load lock chamber inside the ICB apparatus must be opened to atmospheric pressure after the deposition of the sapphire so as to load the silicon material into the single crucible. Such opening of the load lock chamber causes a decrease in the pressure in the vacuum region of the ICB apparatus. Thus, the vacuum region must be re-evacuated to the desired vacuum pressure in order to run the silicon deposition stage of the present invention.

Although the invention has been illustrated and described with respect to a best mode embodiment thereof, it should be understood by those skilled in the art that the foregoing and various other changes, omissions, and additions in the form and detail thereof may be made without departing from the invention.

We claim:

1. A method for forming a sapphire layer and a silicon layer superjacent a substrate, comprising the steps of:

providing sapphire in a first crucible having a first nozzle;

providing silicon in a second crucible having a second nozzle;

positioning a substrate and said crucibles within a vacuum region, said vacuum region having a first pressure level;

heating said first crucible to a first temperature to vaporize said sapphire at a second pressure level within said first crucible, said second pressure level being substantially greater than said first pressure level, such that said sapphire vapor is ejected though said first nozzle, thereby forming clusters of sapphire by adiabatic expansion, said sapphire clusters being formed in said vacuum region, outside said first crucible, substantially in the vicinity of said first nozzle;

ionizing a portion of said sapphire clusters by electron bombardment, thereby providing a remaining portion of non-ionized sapphire clusters;

accelerating said ionized and non-ionized sapphire clusters towards said substrate to form a sapphire layer superjacent said substrate;

heating said second crucible to a second temperature to vaporize said silicon at a third pressure level within said second crucible, said third pressure level being substantially greater than said first pressure level, such that said silicon vapor is ejected though said second nozzle, thereby forming clusters of silicon by adiabatic expansion, said silicon clusters being formed in said vacuum region outside said second crucible, substantially in the vicinity of said second nozzle;

ionizing a portion of said silicon clusters by electron bombardment, thereby providing a remaining portion of non-ionized sapphire clusters; and accelerating said ionized and non-ionized silicon clusters towards said substrate to form a silicon layer superjacent said substrate.

2. The method of claim 1, wherein said first pressure level of said vacuum region is no greater than $1 \times 10^{-5}$ Torr.

3. The method of claim 1, wherein at least one of said first and second crucibles comprise graphite.

4. The method of claim 1, wherein said step of heating said second crucible comprises the step of emitting electrons towards said second crucible to heat said second crucible by electron impact.

5. The method of claim 1, wherein said step of heating said first crucible comprises the step of emitting electrons towards said first crucible to heat said first crucible by electron impact.

6. The method of claim 1, wherein said step of heating said second crucible comprises the step of resistive heating.

7. The method of claim 6, wherein said step of heating said first crucible comprises the step of resistive heating.

8. The method of claim 1, wherein said step of accelerating said silicon clusters towards said substrate comprises the step of applying a first acceleration voltage between said second crucible and said substrate.

9. The method of claim 8, wherein said first acceleration voltage is in the range of 200 to 500 electron volts.

10. The method of claim 8, wherein said step of accelerating said sapphire clusters towards said substrate comprises the step of applying a second acceleration voltage between said first crucible and said substrate.

11. The method of claim 10, wherein said second acceleration voltage is in the range of 200 to 500 electron volts.

12. The method of claim 1, further comprising the step of heating said substrate to a second temperature.

13. The method of claim 12, wherein said second temperature is substantially in the range of 400 to 600 degrees centigrade.

14. The method of claim 1, further comprising the step of providing an oxygen partial pressure within said vacuum region in the range of $5 \times 10^{-5}$ to $1 \times 10^{-4}$ Torr.

15. The method of claim 1, wherein said step of ionizing said silicon clusters comprises the step of applying a first electron ionization current to an electron emitting filament.

16. The method of claim 15, wherein said first electron ionization current is substantially in the range of 200 to 300 milliamps.

17. The method of claim 15, wherein said step of ionizing said sapphire clusters comprises the step of applying a second electron ionization current to an electron emitting filament.

18. The method of claim 17, wherein said second electron ionization current is substantially in the range of 200 to 300 milliamps.

19. The method of claim 1, wherein said second temperature is controlled in response to a vibration frequency of a crystal, said crystal being coupled with said substrate, said vibration frequency corresponding to a deposition rate of said deposited silicon film.

20. The method of claim 19, wherein said first temperature is controlled in response to a vibration frequency of a crystal, said crystal being coupled with said substrate, said vibration frequency corresponding to a deposition rate of said deposited sapphire film.

21. The method of claim 1, wherein said substrate comprises at least one of aluminum, aluminum alloy, oxide, silicon dioxide, silicon nitride, doped glass, undoped glass, and silicon.

22. The method of claim 1, wherein said sapphire layer comprises a thickness substantially in the range of 200 to 4000 Angstroms.

23. The method of claim 1, wherein said silicon layer comprises a thickness substantially in the range of 200 to 4000 Angstroms.

24. The method of claim 1, wherein said sapphire layer is formed superjacent said substrate and said silicon layer is formed superjacent said sapphire layer.

25. A method for forming sapphire and silicon layers superjacent a substrate, said method comprising the steps of:

providing sapphire in a first crucible having a nozzle;

providing silicon in a second crucible having a nozzle;

positioning said first and second crucibles and a substrate within a vacuum chamber, said vacuum chamber having a first pressure level, said substrate comprising at least one of silicon, aluminum, silicon dioxide, silicon nitride, doped glass, undoped glass, and an oxide;

heating said first crucible to a first temperature to vaporize said sapphire at a second pressure level within said first crucible;

heating said second crucible to a second temperature to vaporize said silicon at a third pressure level within said second crucible;

regulating said heating of said first crucible at said first temperature and said second crucible at said second temperature by a vibration frequency of a crystal coupled to said substrate, said vibration frequency corresponding to a deposition rate of said formed silicon and sapphire layers superjacent said substrate, such that said second and third pressure levels substantially exceed said first pressure level, thereby forming clusters of sapphire and silicon, and enabling said sapphire clusters and said silicon clusters to be ejected in the direction of said substrate;

ionizing a portion of said sapphire clusters by electron bombardment, thereby providing a remaining portion of non-ionized sapphire clusters;

ionizing a portion of said silicon clusters by electron bombardment, thereby providing a remaining portion of non-ionized silicon clusters;

accelerating both said ionized and said non-ionized sapphire clusters toward said substrate, thereby forming a sapphire film superjacent said substrate; and accelerating both said ionized and said non-ionized silicon clusters toward said substrate, thereby forming a silicon film superjacent said substrate.

26. The method of claim 25, wherein said regulating said heating of said first crucible at said first temperature and said second crucible at said second temperature comprises the step of:

supercooling said ejected sapphire and silicon clusters by means of adiabatic expansion.

27. The method of claim 25, wherein said first pressure level is of said vacuum region is no greater than $1 \times 10^{-5}$ Torr.

28. The method of claim 25, wherein at least one of said first and second crucibles comprise graphite.

29. The method of claim 25, wherein said step of heating said second crucible comprises the step of emitting electrons towards said second crucible to heat said second crucible by electron impact.

30. The method of claim 29, wherein said step of heating said first crucible comprises the step of emitting electrons towards said first crucible to heat said first crucible by electron impact.

31. The method of claim 25, wherein said step of heating said second crucible comprises the step of resistive heating.

32. The method of claim 31, wherein said step of heating said first crucible comprises the step of resistive heating.

33. The method of claim 25, wherein said step of accelerating said silicon clusters towards said substrate comprises the step of applying a first acceleration voltage between said second crucible and said substrate.

34. The method of claim 33, wherein said first acceleration voltage is in the range of 200 to 500 electron volts.

35. The method of claim 33, wherein said step of accelerating said sapphire clusters towards said substrate comprises the step of applying a second acceleration voltage between said first crucible and said substrate.

36. The method of claim 35, wherein said second acceleration voltage is in the range of 200 to 500 electron volts.

37. The method of claim 25, further comprising the step of heating said substrate to a third temperature.

38. The method of claim 37, wherein said third temperature is substantially in the range of 400 to 600 degrees centigrade.

39. The method of claim 25, further comprising the step of providing an oxygen partial pressure within said vacuum region in the range of $5 \times 10^{-5}$ to $1 \times 10^{-4}$ Torr.

40. The method of claim 25, wherein said step of ionizing said silicon clusters comprises the step of applying a first electron ionization current to an electron emitting filament.

41. The method of claim 40, wherein said first electron ionization current is substantially in the range of 200 to 300 milliamps.

42. The method of claim 40, wherein said step of ionizing said sapphire clusters comprises the step of applying a second electron ionization current to an electron emitting filament.

43. The method of claim 42, wherein said second electron ionization current is substantially in the range of 200 to 300 milliamps.

44. The method of claim 25, wherein said substrate comprises at least one of aluminum, aluminum alloy, oxide, silicon dioxide, silicon nitride, doped glass, undoped glass, and silicon.

45. The method of claim 25, wherein said sapphire layer comprises a thickness substantially in the range of 200 to 4000 Angstroms.

46. The method of claim 25, wherein said silicon layer comprises a thickness substantially in the range of 200 to 4000 Angstroms.

47. The method of claim 25, wherein said sapphire layer is formed superjacent said substrate and said silicon layer is formed superjacent said sapphire layer.

48. A method of forming a wafer comprising a bulk silicon substrate, a layer of sapphire formed superjacent said substrate, and a layer of silicon formed superjacent said sapphire layer, said method comprising the steps of:

depositing sapphire in a first crucible having a nozzle;

positioning said first crucible in a vacuum chamber having a first pressure level;

positioning said substrate in said vacuum chamber;

heating said first crucible to a first to vaporize said sapphire at a second pressure level within said first crucible;

heating said second crucible to a second temperature to vaporize said silicon at a third pressure level within said second crucible;

regulating said heating of said first crucible at said first temperature by a vibration frequency of a crystal coupled to said substrate, said vibration frequency corresponding to a deposition rate of said formed sapphire layer superjacent said substrate, such that said second pressure level substantially exceeds said first pressure level, thereby forming clusters of sapphire, and enabling said sapphire clusters to be ejected in the direction of said substrate;

bombarding said sapphire clusters with electrons, thereby resulting in some number of said sapphire clusters being partially ionized along with some number of sapphire clusters remaining non-ionized;

accelerating both said ionized and non-ionized sapphire clusters toward said substrate to form a sapphire layer superjacent said substrate having a thickness substantially in the range of 200 to 4000 Angstroms;

depositing silicon in a second crucible having a nozzle;

positioning said second crucible in said vacuum chamber;

heating said second crucible to a second temperature to vaporize said silicon at a third pressure level within said second crucible;

regulating said heating of said second crucible at said second temperature by said vibration frequency of said crystal coupled to said substrate, said vibration frequency corresponding to a deposition rate of said formed silicon layer superjacent said sapphire layer, such that said third pressure level substantially exceeds said first pressure level, thereby forming clusters of silicon, and enabling said silicon clusters to be ejected in the direction of said substrate;

bombarding said silicon clusters with electrons, thereby resulting in some number of said silicon clusters being partially ionized along with some number of silicon clusters remaining non-ionized; and accelerating both said ionized and non-ionized silicon clusters towards said substrate to form a silicon layer superjacent said sapphire layer having a thickness substantially in the range of 200 to 4000 Angstroms.

* * * * *